United States Patent
Babaie et al.

(10) Patent No.: US 9,831,847 B2
(45) Date of Patent: *Nov. 28, 2017

(54) TRANSFORMER BASED IMPEDANCE MATCHING NETWORK AND RELATED POWER AMPLIFIER, ADPLL AND TRANSMITTER BASED THEREON

(71) Applicant: Short Circuit Technologies LLC, Rochester, NY (US)

(72) Inventors: Masoud Babaie, Pijnacker (NL); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/584,257

(22) Filed: May 2, 2017

(65) Prior Publication Data

US 2017/0237407 A1    Aug. 17, 2017

Related U.S. Application Data

(63) Continuation of application No. 14/874,421, filed on Oct. 3, 2015, now Pat. No. 9,685,910.

(Continued)

(51) Int. Cl.
| | |
|---|---|
| H03H 7/38 | (2006.01) |
| H01F 27/28 | (2006.01) |
| H03F 1/02 | (2006.01) |
| H03F 1/56 | (2006.01) |
| H03F 3/193 | (2006.01) |

(Continued)

(52) U.S. Cl.
CPC .......... *H03H 7/38* (2013.01); *H01F 27/2823* (2013.01); *H01F 27/29* (2013.01); *H01Q 1/50* (2013.01); *H03F 1/0205* (2013.01); *H03F 1/565* (2013.01); *H03F 3/193* (2013.01); *H03F 3/211* (2013.01); *H03F 3/2171* (2013.01); *H03F 3/2176* (2013.01); *H03F 3/245* (2013.01); *H03H 7/40* (2013.01); *H03F 2200/318* (2013.01); *H03F 2200/451* (2013.01); *H03F 2200/534* (2013.01); *H03F 2200/537* (2013.01);

(Continued)

(58) Field of Classification Search
CPC .... H03H 7/38; H03H 7/40; H03F 1/56; H03F 1/565; H03F 1/0205; H01F 27/2804; H01F 2027/2809
USPC .............................. 333/32, 33, 124, 129, 177
See application file for complete search history.

(56) References Cited

U.S. PATENT DOCUMENTS 9,685,910 B2 *  6/2017  Babaie .................. H03F 1/0205

* cited by examiner

*Primary Examiner* — Stephen E Jones
(74) *Attorney, Agent, or Firm* — Zaretsky Group PC; Howard Zaretsky (57) ABSTRACT

A novel and useful transmitter (TX) architecture for ultra-low power (ULP) radios. An all-digital PLL employs a digitally controlled oscillator (DCO) having switching current sources to reduce supply voltage and power consumption without sacrificing phase noise and startup margins. It also reduces 1/f noise allowing the ADPLL after settling to reduce its sampling rate or shut it off entirely during direct DCO data modulation. A switching power amplifier integrates its matching network while operating in class-E/$F_2$ to maximally enhance its efficiency. The transmitter has been realized in 28 nm CMOS and satisfies all metal density and other manufacturing rules. It consumes 3.6 mW/5.5 mW while delivering 0 dBm/3 dBm RF power in Bluetooth Low-Energy.

22 Claims, 10 Drawing Sheets

Related U.S. Application Data (60) Provisional application No. 62/059,448, filed on Oct. 3, 2014.

(51) Int. Cl.
    *H03F 3/21*          (2006.01)
    *H03F 3/217*       (2006.01)
    *H01F 27/29*      (2006.01)
    *H01Q 1/50*        (2006.01)
    *H03H 7/40*        (2006.01)
    *H03F 3/24*         (2006.01)

(52) U.S. Cl.
    CPC ............... *H03F 2200/541* (2013.01); *H03F 2203/21106* (2013.01); *H03F 2203/21139* (2013.01)

TRANSFORMER BASED IMPEDANCE MATCHING NETWORK AND RELATED POWER AMPLIFIER, ADPLL AND TRANSMITTER BASED THEREON

REFERENCE TO PRIORITY APPLICATIONS

This application is a continuation of U.S. application Ser. No. 14/874,421, filed Oct. 3, 2015, entitled "Transformer Based Impedance Matching Network and Related Power Amplifier, ADPLL And Transmitter Based Thereon," which claims the benefit of U.S. Provisional Application Ser. No. 62/059,448, filed Oct. 3, 2014, entitled "Power Amplifier," both of which are incorporated herein by reference in their entirety.

FIELD OF THE INVENTION

The present invention relates generally to communication circuits and in particular to a transformer based impedance matching network and a power amplifier and transmitter based thereon.

BACKGROUND OF THE INVENTION

Ultra-low power (ULP) transmitters are key subsystems for wireless sensor networks and internet-of-things (IoT). The system lifetime, however, is severely limited by their power consumption and available battery technology. The two most power hungry components of modern day transceivers are the oscillators, i.e. the digitally control oscillator (DCO), and the power amplifier (PA). Energy harvesting techniques, which are now enjoying more widespread use, can enable further applications but typically provide lower supply voltages than the deep-nanoscale CMOS supply of 1V. For example, on-chip solar cells typically generate about 0.2 to 0.8V. Although dc-dc converters can boost harvester output voltage, the poor efficiency ($\leq 80\%$) of most of these converters introduces a significant power penalty and wastes much of the harvested energy.

Therefore, RF oscillators as well as power amplifiers as two of the most power hungry blocks in the transceiver must be very power efficient and preferably operate directly at the output of the energy harvester. There is thus a need for a transmitter switching current source oscillator topology and power amplifier topology that is suitable for use in ULP applications.

SUMMARY OF THE INVENTION

The present invention is a transmitter (TX) architecture for ultra-low power (ULP) radios. An all-digital PLL employs a digitally controlled oscillator (DCO) having switching current sources to reduce supply voltage and power consumption without sacrificing phase noise and startup margins. It also reduces 1/f noise allowing the ADPLL after settling to reduce its sampling rate or shut it off entirely during direct DCO data modulation. A switching power amplifier integrates its matching network while operating in class-$E/F_2$ to maximally enhance its efficiency. The transmitter has been realized in 28 nm CMOS and satisfies all metal density and other manufacturing rules. It consumes 3.6 mW/5.5 mW while delivering 0 dBm/3 dBm RF power in Bluetooth Low-Energy. The transceiver can be incorporated within a wide range of circuit applications and is especially suitable for use in low power wireless applications such as battery powered or battery-less mobile devices, internet-of-things powered by batteries or energy harvester devices, etc. The transmitter of the invention is highly reconfigurable and is multi-standard ready with support for different modulations and data rates from 50 kbps to 1 Mbps. For example, using the DPA for generation of the time-variant signal envelope, a ULP 2.3/2.4 GHz band BT-LE transmitter can be realized for emerging body area network (BAN) applications.

The ultra-low power Bluetooth LE transmitter of the present invention demonstrates excellent power efficiency and phase purity, while abiding by the strict 28 nm CMOS technology manufacturing rules. A novel switching current source oscillator combines advantages of low supply voltage of the conventional NMOS cross-coupled oscillator with high current efficiency of the complementary push-pull oscillator to reduce the oscillator supply voltage and dissipated power further than practically possible compared with prior art oscillators. Furthermore, due to the low wander of DCO, digital power consumption of ADPLL is reduced by scaling the rate of the sampling clock to the point of its complete shutdown. A fully integrated differential class-$E/F_2$ switching PA is utilized to improve system efficiency at low output power of 0 to 3 dBm. Its associated impedance matching network was realized by exploiting different behaviors of a 2:1 step-down transformer in differential and common-mode excitations.

Several novel techniques are exploited in this work to enhance the efficiency of the ULP transmitter. First, the most power hungry circuitry, such as digitally controlled oscillator (DCO) and output stage of power amplifier (PA), are able to operate directly at the low voltage of typical energy harvesters. Second, a novel switching current source oscillator (in one embodiment optimized for 28 nm CMOS) reduces power and supply voltage without compromising the robustness of the oscillator start-up or loading of its tank quality factor. Third, due to the low wander (i.e. low flicker noise) of the DCO, digital power consumption of the remainder of the all-digital PLL (ADPLL) (e.g., programmable divider, FREF controller, smooth shifting circuits, etc.) is significantly reduced by scaling the rate of the sampling clock to the point of its complete shut-down. Fourth, a fully integrated differential class-$E/F_2$ switching PA is utilized to optimize high power added efficiency (PAE) at low output power of 0 to 3 dBm.

There is thus provided in accordance with the invention, an impedance matching network receiving a driving signal consisting of both common mode and differential mode signal components, comprising a transformer including a primary winding configured to receive the driving signal, a secondary winding, and wherein exciting the primary winding with the common mode signal at a second harmonic frequency causes substantially no current to be induced on the secondary winding.

There is also provided in accordance with the invention, an impedance matching network receiving a driving signal consisting of both common mode and differential mode signal components, comprising a transformer including a primary winding having a first inductance and configured to receive the driving signal, a secondary winding having a second inductance, a first capacitance coupled to the transformer primary winding, a second capacitance coupled to the transformer secondary winding, and wherein exciting the primary winding with the common mode signal at a second harmonic frequency causes substantially no current to be induced on the secondary winding.

There is further provided in accordance with the invention, a method of impedance matching, the method comprising providing a transformer having a primary winding and a secondary winding, driving the primary winding with a signal containing a fundamental frequency and a second harmonic frequency, and in response to the signal at the second harmonic frequency, magnetic flux induced in the primary winding cancels itself out resulting in substantially no current being generated on the secondary winding.

There is also provided in accordance with the invention, a class $E/F_2$ power amplifier, comprising an amplifier comprising a plurality of switching transistors, the amplifier operative to control an amplitude modulation and to provide a driving signal, an impedance matching network coupled to the amplifier, the impedance matching network comprising a transformer including a primary winding configured to receive the driving signal, and a secondary winding, and wherein exciting the primary winding with a common mode signal at a second harmonic frequency causes substantially no current to be induced on the secondary winding.

There is further provided in accordance with the invention, a mobile device, comprising memory for storing application program code and data, a processor coupled to the memory, at least one radio transceiver coupled to the processor, the radio transceiver comprising an impedance matching network, the impedance matching network comprising a transformer including a primary winding configured to receive a driving signal, and a secondary winding, and wherein exciting the primary winding with a common mode of the signal at a second harmonic frequency causes substantially no current to be induced on the secondary winding.

There is also provided in accordance with the invention, an Internet of Things (IoT) network, comprising a plurality of nodes, one or more nodes comprising a processor, a sensor coupled to the processor, a radio coupled to the processor, the radio comprising an impedance matching network, the impedance matching network comprising a transformer including a primary winding configured to receive a driving signal, and a secondary winding, and wherein exciting the primary winding with a common mode of the signal at a second harmonic frequency causes substantially no current to be induced on said secondary winding.

BRIEF DESCRIPTION OF THE DRAWINGS

The invention is herein described, by way of example only, with reference to the accompanying drawings, wherein.

DETAILED DESCRIPTION OF THE INVENTION

The present invention provides a transmitter (TX) architecture for ultra-low power (ULP) radios. The architecture comprises an all-digital PLL that employs a digitally controlled oscillator (DCO) having switching current sources to reduce supply voltage and power consumption without sacrificing phase noise and startup margins. It also reduces 1/f noise allowing the ADPLL after settling to reduce its sampling rate or shut it off entirely during direct DCO data modulation. A switching power amplifier integrates its transformer based impedance matching network while operating in class-$E/F_2$ to maximally enhance its efficiency. The transceiver can be incorporated within a wide range of circuit applications and is especially suitable for use in low power wireless applications such as battery powered or battery-less mobile devices, internet-of-things (IoT) powered by batteries or energy harvester devices, etc.

Switching Current Source Oscillator

Figure 1:
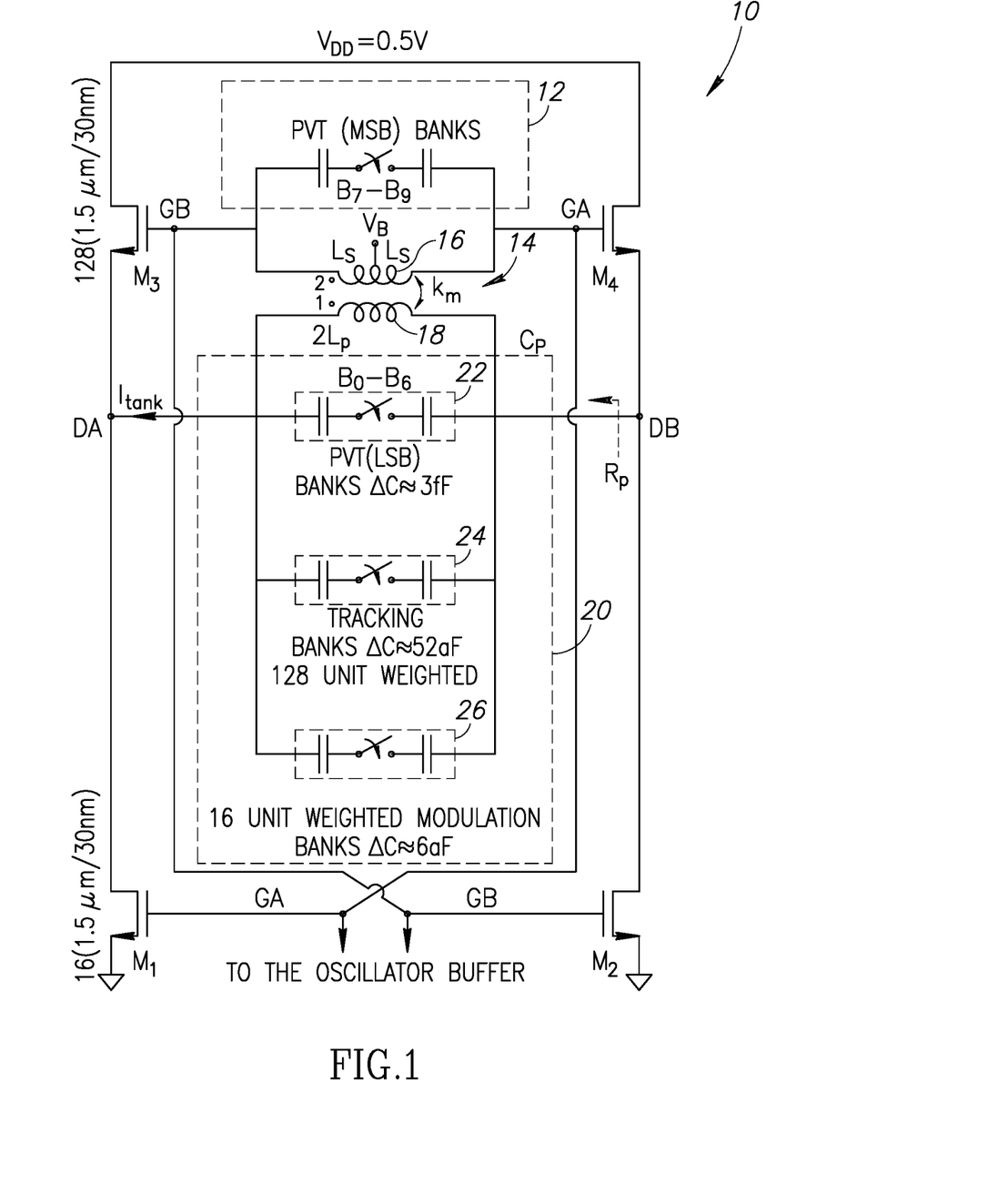
FIG. 1 is a high level schematic diagram illustrating an example switching current source oscillator of the present invention.
Figure 2:
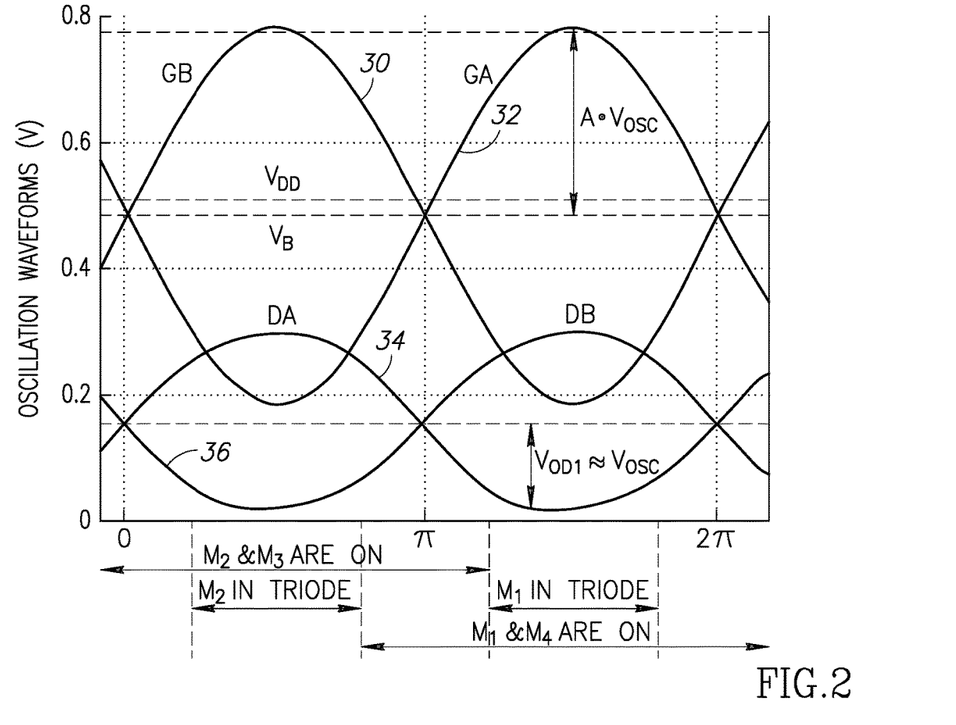
FIG. 2 is a waveform diagram illustrating various waveforms and operational regions of transistors $M_{1-4}$ across the oscillation period.
Figure 3:
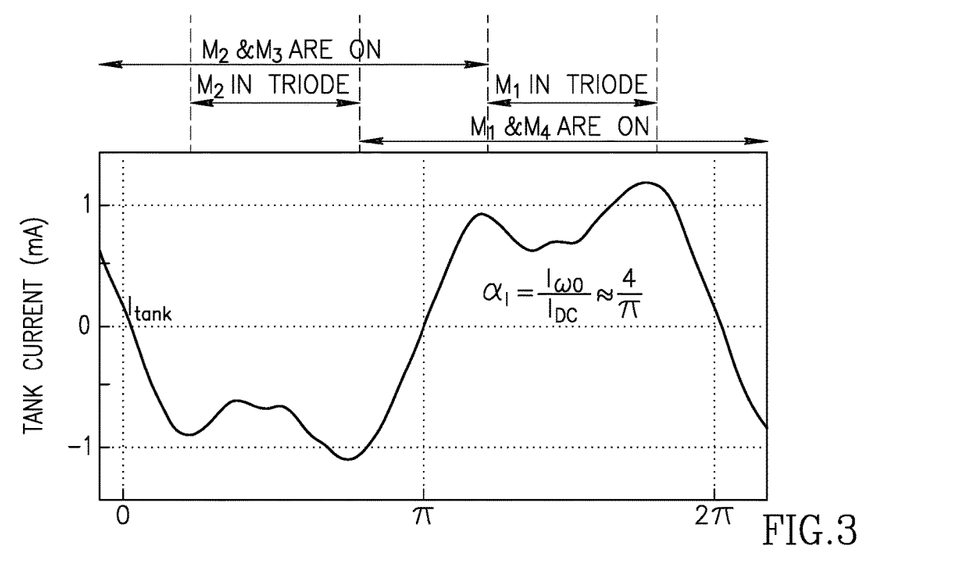
FIG. 3 is a waveform diagram illustrating the tank current.

A high level schematic diagram illustrating an example switching current source oscillator of the present invention is shown in FIG. 1. A waveform diagram illustrating various waveforms and operational regions of transistors $M_{1-4}$ across the oscillation period is shown in FIG. 2. A graph of the tank current is shown in FIG. 3. The oscillator, generally referenced 10, comprises transistors $M_1$, $M_2$, $M_3$ and $M_4$ of a similar type (e.g., all four NMOS or PMOS), transformer 14 having primary winding 18 and secondary winding 16, primary capacitor $C_p$ 20 coupled across the primary winding and secondary capacitor $C_s$ 12 coupled across the secondary winding. In one embodiment, primary capacitor $C_p$ 20 comprises a plurality of switched capacitor banks including PVT (LSB) capacitor banks 22, tracking banks 24 and 16 unit weighted modulation banks 26. Secondary capacitor $C_s$ 12 comprises PVT (MSB) switched capacitor banks.

Considering IoT applications, the phase noise (PN) specifications are fairly relaxed and can be easily met by LC oscillators as long as the Barkhausen start-up criterion is satisfied over process, voltage and temperature (PVT) variations. Consequently, reducing the power consumption of the DCO ($P_{DCO}$) is the ultimate goal of IoT applications. The $P_{DCO}$ can be calculated by the following:

$$P_{DCO} = V_{DD}^2 \cdot \frac{\alpha_V}{\alpha_I} \cdot \frac{1}{R_p} \tag{1}$$

where $R_p$ is an equivalent input parallel resistance of the tank modeling its losses; $\alpha_I$ is the current efficiency, defined as the ratio of the fundamental component of tank's current $I_{\omega_0}$ over the oscillator DC current $I_{DC}$; and $\alpha_V$ is the voltage efficiency, defined as the ratio of the drain oscillation amplitude $V_{osc}$ (single-ended) over the supply voltage $V_{DD}$.

Lower $P_{DCO}$ can be addressed by scaling up $R_p = L_p \omega_0 Q_t$ simply via a large multi-turn inductor. Topology parameters such as the oscillator's $\alpha_I$ and minimum supply voltage ($V_{DDmin}$), however, can also play an important role in the minimum achievable $P_{DC}$. The oscillator shown in FIG. 1 illustrates an example oscillator embodiment that combines the best features of a conventional cross-coupled NMOS oscillator (i.e. low $V_{DD}$) and a complementary push-pull oscillator (i.e. high $\alpha_I$) from the standpoint of ultra-low power (ULP).

As indicated in FIGS. 1, 2 and 3, the oscillation voltage at $G_B$ is high within the first half-period. Hence, only transistors $M_2$ and $M_3$ are on and the current flows from the left to the right side of the tank's primary inductor $2L_p$ 18. Transistors $M_1$ and $M_4$, however, are turned on for the second half-period and the tank's current direction is reversed. Consequently, like in the push-pull structure, the current flow in the tank is reversed every half-period thus doubling the oscillator's $\alpha_I$ to $4/\pi$.

The minimum $V_{DD}$ is determined by the bias voltage $V_B = V_{OD1} + V_{gs3}$. Hence, $M_{3,4}$ should work (when not turned off) in weak-inversion keeping $V_{gs3} < V_t$ to achieve lower $V_{DDmin}$. Note that since there is no DC current drawn from $V_B$, an RC filter of a long time constant can be placed between $V_{DD}$ and $V_B$ to further reduce the bias voltage noise. Since transistor $M_{1-4}$ have the same DC gate voltage, $M_{3,4}$ sub-threshold operation also provides enough $V_{OD}$ overdrive for the switching current source devices $M_{1,2}$ to operate in the saturation region at the DC operating point. Thus, unlike conventional oscillators, the dimension of devices $M_{3,4}$ are preferably several times (e.g., eight) larger than current source devices in order to guarantee their weak inversion operation. Furthermore, the oscillation swing should go further than $V_{OD1,2}$ at nodes DA/DB, which is chosen to be ~150 mV to satisfy the system's phase noise specification by a margin of a few dB. Consequently, as with cross-coupled NMOS oscillators, the proposed structure can operate at a $V_{DD}$ as low as 0.5 V.

The transformer voltage gain A enhances the oscillation swing at the gates of transistors $M_{1-4}$ to even greater than $V_{DD}$ and guarantees the start-up over PVT variations. Furthermore, the combination of A and the effective transconductance gain of $M_{1-4}$ should must compensate the tank losses. Therefore, the contribution of $M_{1-4}$ to the oscillator phase noise (PN) reduces by A, which compensates for the effect of lower voltage efficiency $\alpha_V$ of this structure on the oscillator PN and figure of merit (FoM).

Larger tank input impedance $R_p$ is also beneficial to reduce the oscillator's power consumption. $R_p$ reaches its maximum when $L_s C_s / L_p C_p = 1$ for $Q_p \approx Q_s$. Hence, the PVT tuning capacitors are divided in the transformer's primary and secondary windings to roughly satisfy this criterion.

Switching the bias of $M_{1-4}$ devices reduces both their 1/f noise and also the DC component of their effective impulse sensitivity function (ISF) function. Consequently, a much lower $1/f^3$ PN corner is expected than in traditional oscillators. Note that a more detailed description of the operation of the oscillator of FIG. 1 can be found in U.S. application Ser. No. 14/874,401, to Masoud Babaie et al., entitled "Switching Current Source Radio Frequency Oscillator," now U.S. Pat. No. 9,397,613, incorporated herein by reference in its entirety.

Class-E/F$_2$ Power Amplifier

Figure 4:
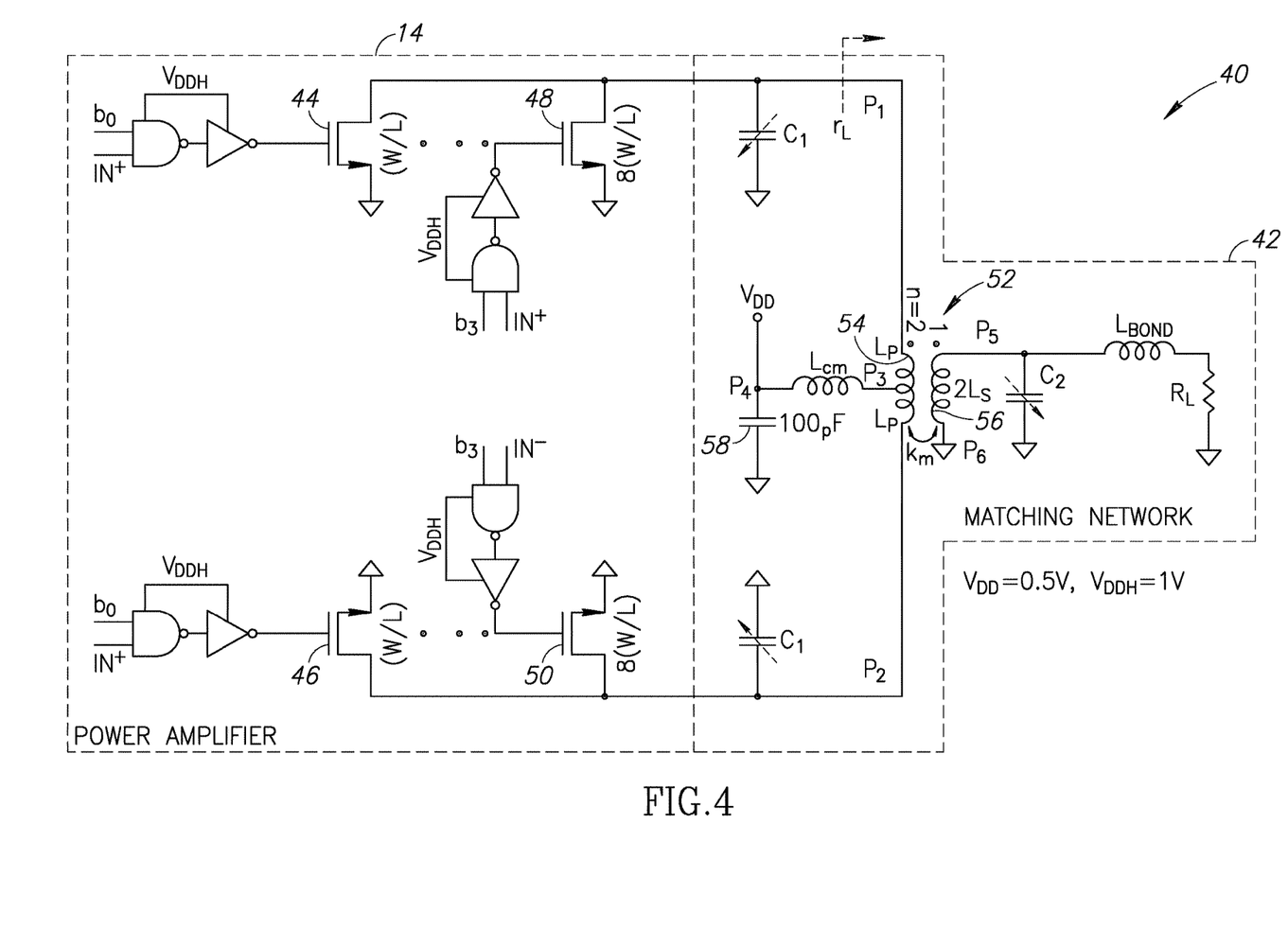
FIG. 4 is a high level schematic diagram illustrating an example digital power amplifier acting as an RF-DAC and impedance matching network of the present invention.

The present invention provides a fully integrated PA optimized for low output power ($P_{out} < 3$ dBm). Power added efficiency (PAE) greater than 40% is very challenging, especially when differential structure is needed to satisfy the stringent $2^{nd}$ harmonic emissions. A high level schematic diagram illustrating an example RF-DAC and impedance matching network of the present invention is shown in FIG. 4. In this example embodiment, the circuit, generally referenced 40, comprises a digital power amplifier section 41 including a plurality of transistors 44, 46, 48, 50 and matching network 42 including capacitors $C_1$, $C_2$, 58, inductors $L_{cm}$, $L_{bond}$, load resistor $R_L$ and transformer 52 having primary winding 54, secondary winding 56 and a 2:1 turns ratio.

To realize such a low $P_{out}$, the invention employs an impedance matching network having a large impedance transformation ratio (ITR) to increase the load resistance $r_L$ seen by the drain terminals of the power amplifier (PA) transistors to much higher than the $R_L = 50$ ohm antenna impedance.

$$ITR = r_L / R_L = 0.5 \cdot n^2 \cdot k_m^2 \qquad (2)$$

Unfortunately, the differential structure and imperfect magnetic coupling factor $k_m$ of the matching network's transformer 52 exhibit a reverse effect of reducing $r_L$ and thus the ITR. Hence, the transformer turns ratio (n:1) should be large (e.g., n greater than four) to compensate for them. The Q-factor of the transformer windings and thus its efficiency, however, drops dramatically with n greater than two. Consequently, the PAE of prior art integrated power amplifiers is relatively low (e.g., less than 30%) or off-chip components are used in their matching networks.

The drain efficiency $\eta_D$ of class-E/F switch-mode PA can be calculated using the following expression:

$$\eta_D = \frac{(C_{out}/C_1)}{(C_{out}/C_1) + F_C F_I^2 R_{on} C_{out} \omega_0}. \qquad (3)$$

where $C_1$ is the PA's required shunt capacitance to satisfy class-E/F zero-voltage and zero-slope (ZVS) switching. $R_{on}$ is the on-state channel resistance of transistor $M_1$. $C_{out}$ is the output capacitance of transistor $M_1$. Note that $R_{on} \times C_{out}$ is a constant at a given technology and invariant to changes in the width of $M_1$. $F_I$ is defined as the ratio of RMS over DC values of $M_1$ drain current. $F_C$ is the PA waveform factor. Both $F_I$ and $F_C$ are merely a function of matching network strategy and do not change over technology or PVT variations.

A smaller $P_{out}$ can also be realized by using a lower $V_{DD}$ for the drains of the PA transistors (e.g., 0.5V) without any degradation of $\eta_D$, as indicated by Equation 3. As a consequence, the required ITR will be smaller, which results in better efficiency of the output matching network of the PA. Furthermore, the drain voltage of the switching transistor is also limited to less than or equal to 1.5 V thus alleviating reliability issues due to gate oxide breakdown. Equation 3 also indicates that the switching amplifiers with smaller $F_C \cdot F_I^2$ inherently demonstrate higher efficiency. This is highlighted by Table 1 presented below.

TABLE 1

$F_C \cdot F_I^2$ For Different Flavors of Class-E/F Power Amplifier

|  | E | E/F$_2$ | E/F$_3$ | E/F$_{2,3}$ | E/F$_4$ | E/F$_{2,4}$ | E/F$_{3,4}$ | E/F$_5$ |
|---|---|---|---|---|---|---|---|---|
| $F_C \cdot F_I^2$ | 7.44 | 2.47 | 7.25 | 4.99 | 5.88 | 2.06 | 5.06 | 7.35 |

For example, class-E PA efficiency can be improved by realizing an additional open circuit as the PA switches' effective load at $2^{nd}$ harmonic $2\omega_0$ (i.e. class-E/F$_2$ operation). Furthermore, class-E/F$_2$ exhibits a better tolerance to $C_{out}$ variations due to the role of $2^{nd}$ harmonic tuning in smoothing the drain voltage waveform. These benefits, however, come at the expense of almost three times lower power gain for PA transistors compared to that in the conventional class-E setup. The power gain of 28 nm NMOS devices, however, is high enough at the relatively low frequency of 2.4 GHz such that a 4.5 dB power gain penalty has a negligible effect on the efficiency of the total system.

Figure 5:
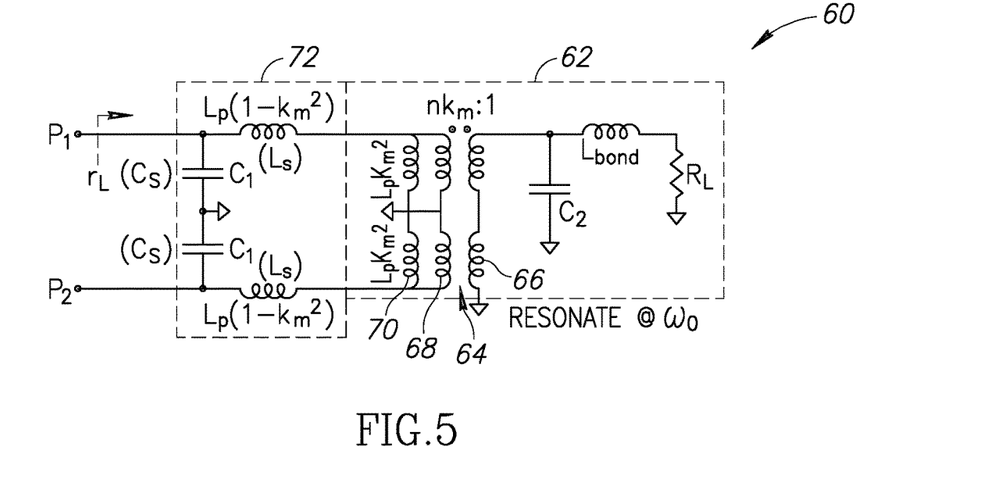
FIG. 5 is a high level schematic diagram illustrating the equivalent circuit of the PA matching network for the differential mode (DM)

A high level schematic diagram illustrating the equivalent circuit of the PA matching network for the differential mode is shown in FIG. 5. The circuit, generally referenced 60, comprises ideal transformer 64 having primary 68, secondary 66, impairment winding $L_p k_m^2$ 70. Block 62 including the transformer's secondary inductance 66 $2L_s$ and capacitor $C_2$ resonate at $\omega_0$ to optimize the matching network efficiency. Furthermore, the transformer's leakage inductance $L_p(1-k_m^2)$ and primary capacitor $C_1$, respectively, in block 72 realize the required series inductance and shunt capacitance of a class-E/F power amplifier to satisfy its ZVS switching criteria.

Figure 6:
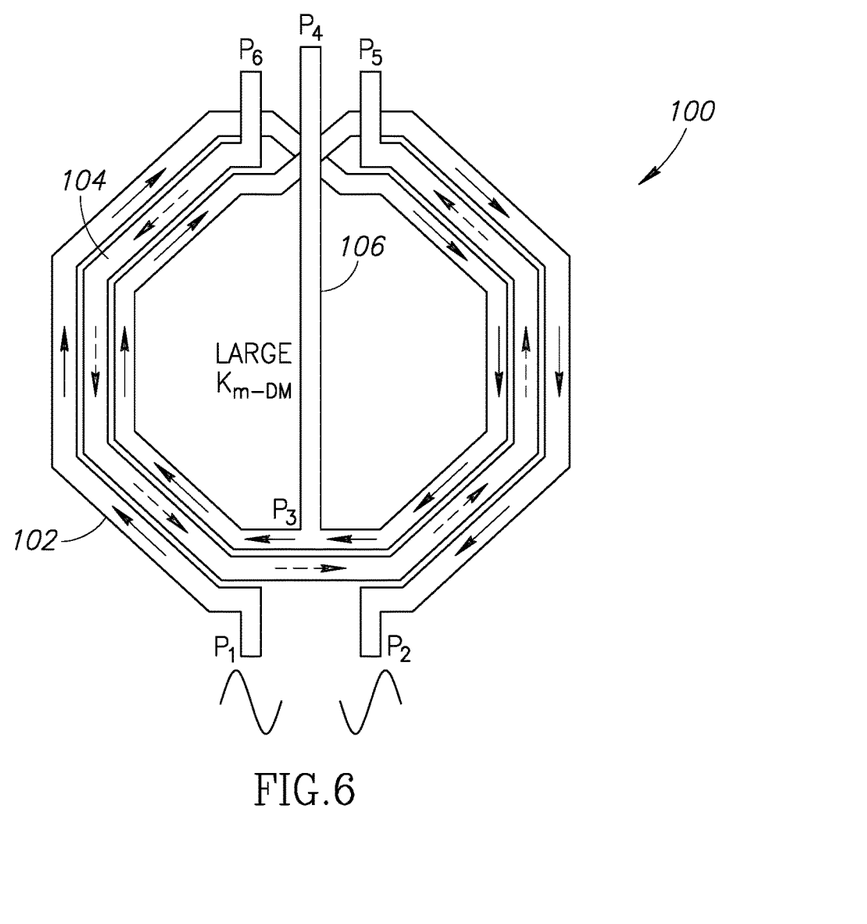
FIG. 6 is a diagram illustrating the behavior of the step-down transformer in the differential mode (DM)
Figure 9:
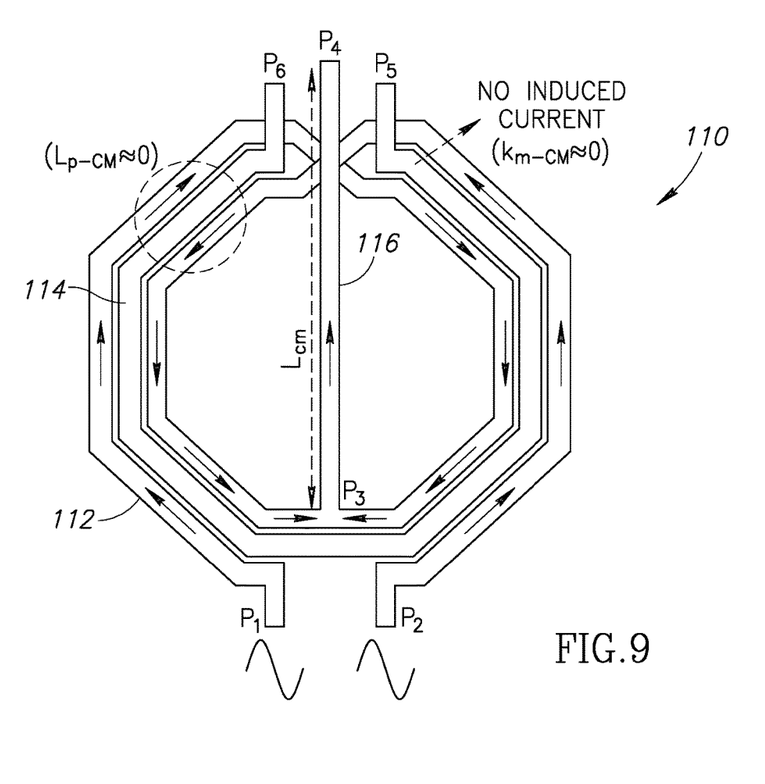
FIG. 9 is a diagram illustrating the behavior of the step-down transformer in the common mode (CM)
Figure 10:
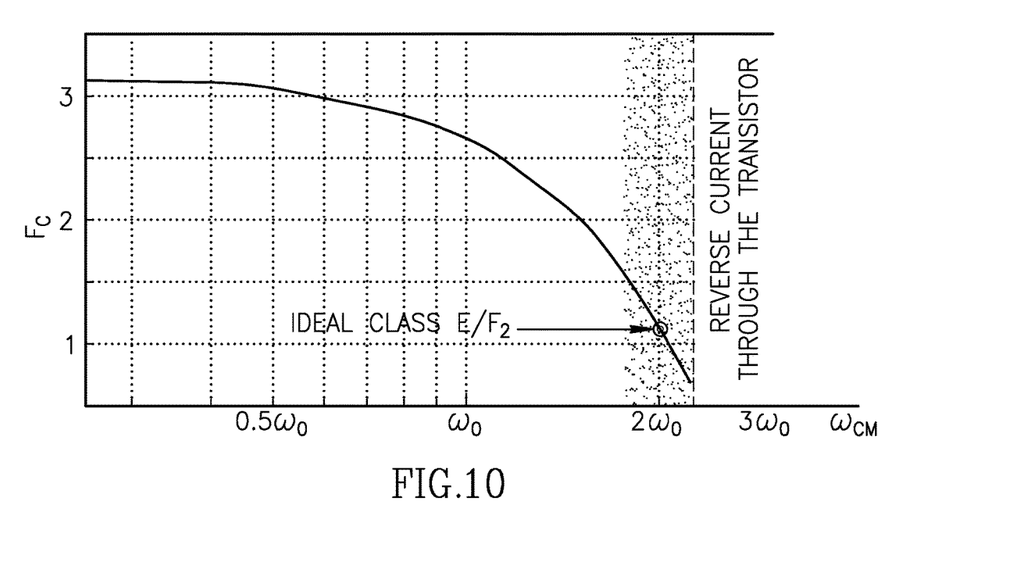
FIG. 10 is a graph illustrating $F_c$ versus frequency.

As illustrated in FIGS. 6 and 9, the step-down 2:1 transformer 52 (FIG. 4) acts differently to common-mode (CM) and differential-mode (DM) input signals. FIG. 6 illustrates the behavior of the step-down transformer in the differential mode (DM) where the current induced in the secondary is not zero. In contrast, as shown in FIG. 9, when the primary 112 of transformer 110 is excited by a CM signal at $2\omega_0$, the magnetic flux excited within two turns of the primary winding cancels itself out. Consequently, the primary inductance of the transformer 110 is negligible and no current is induced at the transformer's secondary 114 ($k_{m\text{-}CM} \approx 0$). Hence, $R_L$, $L_s$ and $C_2$ cannot be seen by the $2\omega_0$ component of the drain current. The common mode equivalent circuit resonates at $2\omega_0$ satisfying the requirements for class-F$_2$ operation. FIG. 10 indicates that $F_C$ is just slightly degraded when CM resonance lies 25% away from $2\omega_0$. Thus, this PA is quite insensitive to the precise CM inductance value, which further promotes a wide bandwidth operation.

Figure 8:
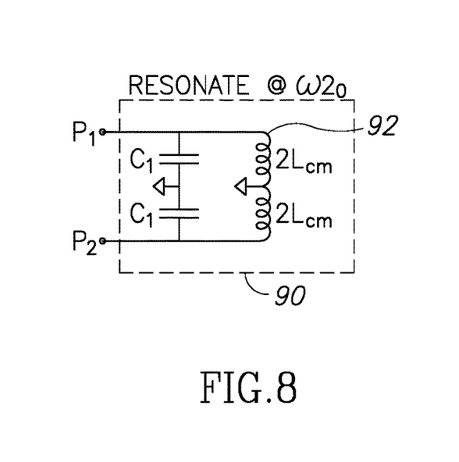
FIG. 8 is a high level schematic diagram illustrating the equivalent circuit of the PA matching network for the common mode (CM)

Furthermore, the CM inductance seen by the PA transistors is mainly determined by the dimension of the trace 116 between the transformer center-tap and decoupling capacitors at the $V_{DD}$ node, which roughly must resonate with $C_1$ at $2\omega_0$ to realize the class-E/F$_2$ operation, as shown in FIG. 8.

Figure 7:
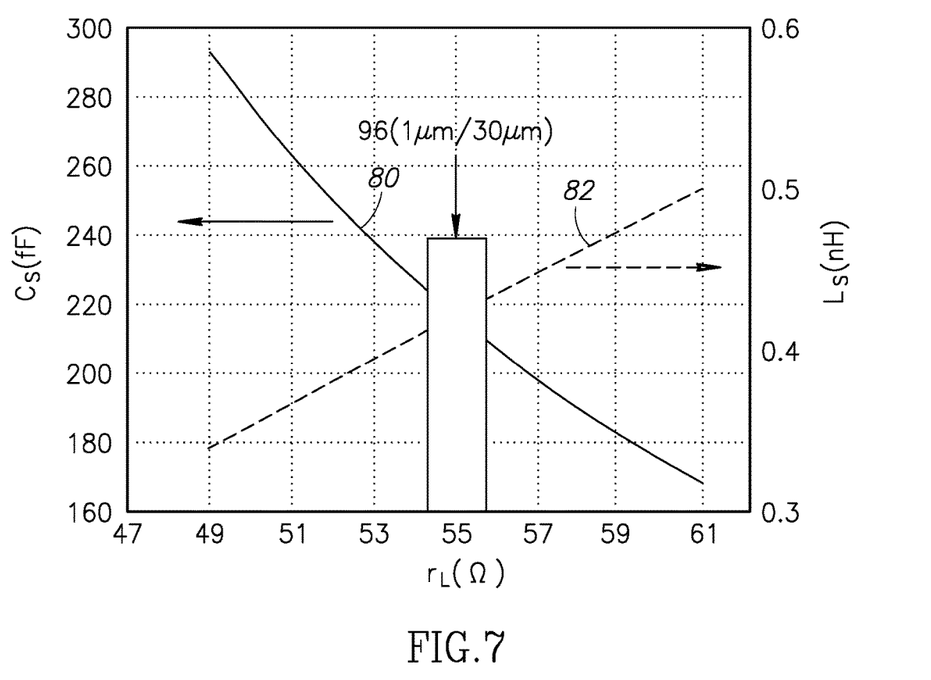
FIG. 7 is a graph illustrating $C_s$ and $L_s$ versus $r_L$.

FIG. 7 shows the optimum required class-E/F$_2$ PA shunt capacitance $C_S$ and series inductance $L_S$ at fundamental frequency versus the load resistance presented by the matching network. The matching network geometry design is initiated by choosing the switch transistor dimension such that its output capacitor absorbs the entire $C_S$. $C_S$, however, also depends on $L_S$ and the load resistance presented by the matching network, as indicated from FIG. 7. Thus, several iterations are needed to find the optimal size combination of the transistor, transformer and matching network. Note that the class-E/F$_2$ optimal combination is different from the goal of maximizing the output power or gain.

All-Digital Phase-Locked Loop Architecture

Figure 11:
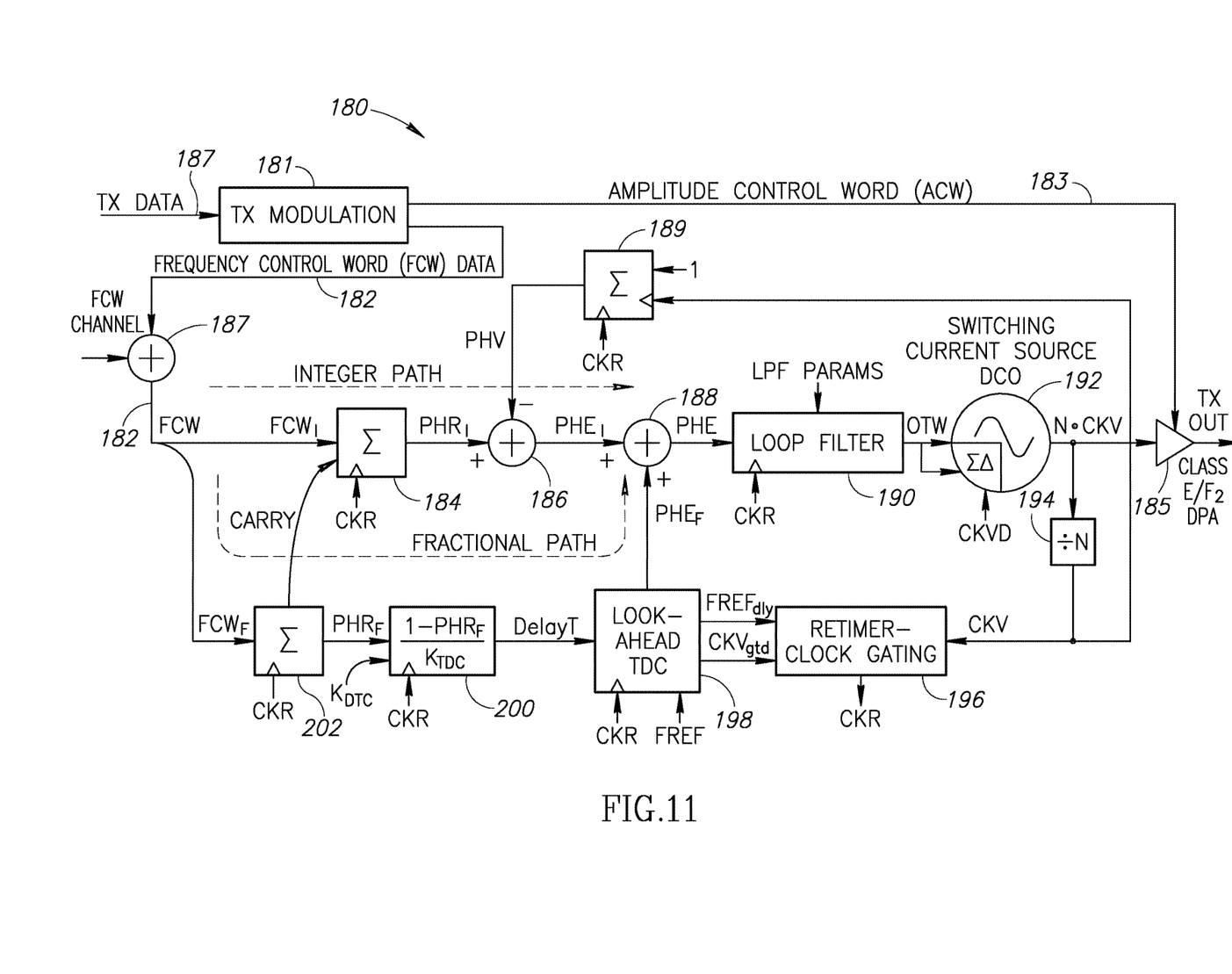
FIG. 11 is a high level block diagram illustrating an example ultra-low power (ULP) all-digital PLL (ADPLL) of the present invention.

A high level block diagram illustrating an example ultra-low power (ULP) all-digital PLL (ADPLL) of the present invention is shown in FIG. 11. The ADPLL has numerous applications including, for example, use in a 4G cellular radio. Transmitter (TX) data 187 is input to the TX modulation block 181 which functions to generate the frequency command word (FCW) 182 and the amplitude command word (ACW) 183. The ACW controls amplitude modulation of the class-E/F$_2$ DPA 185 of the present invention. The FCW is split into its integer FCW and fractional FCW$_F$ parts, with separate reference accumulators 184, 202 that generate the integer and fractional part of the reference phase, PHR$_I$ and PHR$_F$, respectively. In order to properly accumulate the FCW as a whole, a carry is transferred to the integer accumulator whenever an overflow of the fractional part occurs. A synchronous 8-bit counter serves as the variable accumulator 189 and produces the variable phase PHV that is subtracted from PHR$_I$ via subtractor 186 to provide the integer part of the phase error PHE$_I$. PHR$_F$ is used to calculate the "look-ahead TDC" delay code based on the estimated delay characteristic of the look-ahead TDC, (i.e. a combination of a digital-to-time converter followed by a TDC), which in turn is applied to the look-ahead TDC 198 through a gain. A look-ahead TDC gain estimation block 200, based on a well-known iterative adaptation algorithm, is implemented on chip to dynamically track delay estimation errors due to PVT variations. The digitized output of the TDC represents the fractional part of the phase error, PHE$_F$ that is combined with PHE$_I$ via summer 188 to yield the total fixed-point representation of the phase error PHE.

The phase error PHE is then filtered via loop filter 190, in order to properly set the dynamics of the loop. A reconfigurable proportional integral controller within the loop filter block 190 is followed by a DCO decoder also within the loop filter block 190 to generate the oscillator tuning word (OTW). The DCO 192 comprises the switching current source DCO circuit of the present invention described supra in connection with FIG. 1 and includes switched capacitor banks that are dithered using a $2^{nd}$-order MASH $\Sigma\Delta$ modulator in order to achieve a finer equivalent frequency resolution and push the quantization noise at higher offset frequencies where they are more easily filtered out and do not contribute significantly to the total jitter. The operation frequency of the $\Sigma\Delta$ modulators can be dynamically selected between different divider versions of the oscillator output in order to meet the required performance as a trade-off between power consumption and jitter.

In one embodiment, for the feasibility of the variable accumulator implementation, the feedback path was chosen to operate at a maximum 2.5 GHz, which means that a divide-by-two version of the transformer-based DCO output is fed back to the variable accumulator and the look-ahead TDC. Division by two is achieved using a current mode logic (CML) ÷4 divider cascaded with a CMOS digital divider. These dividers are represented in FIG. 11 by the ÷N block 194. Since the loop feedback operates on a divided version of the output, the effective frequency command word is adjusted accordingly. Therefore, one half of the multiplication ratio is accumulated at the ADPLL.

As mentioned supra, the retimer clock gating circuit 196 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

Figure 12:
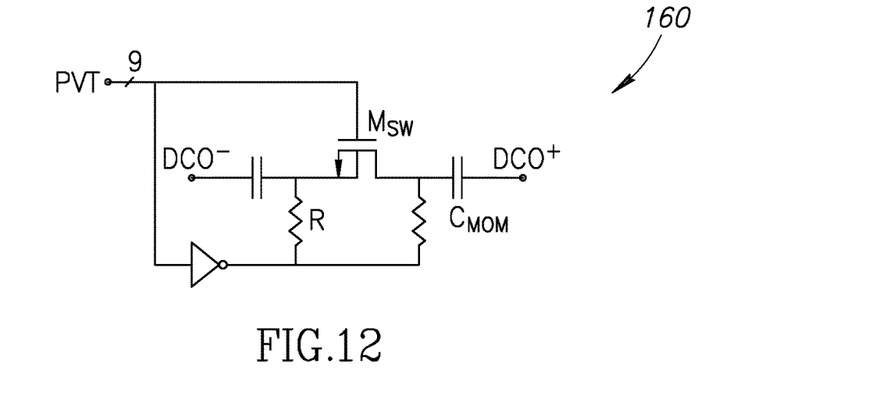
FIG. 12 is a high level schematic diagram illustrating a first example capacitor bank.

A high level schematic diagram illustrating a first example capacitor bank is shown in FIG. 12. In one embodiment, the capacitor bank, generally referenced 160, is used in the PVT MSB banks 12 (FIG. 1) for coarse frequency tuning of the oscillator. It is also used in the PVT LSB banks 22 for fine frequency tuning of the oscillator.

Figure 13:
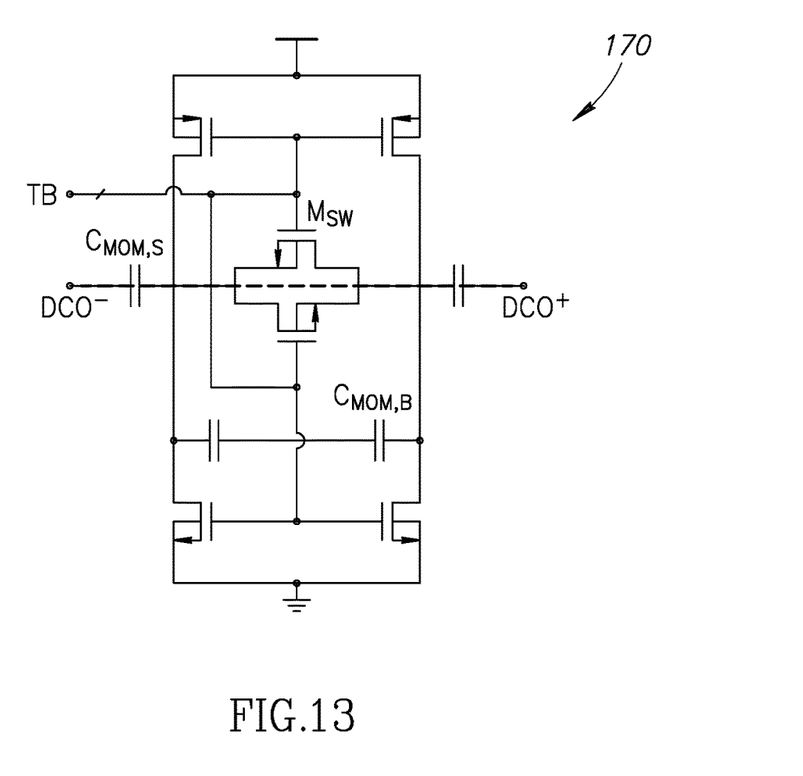
FIG. 13 is a high level schematic diagram illustrating a second example capacitor bank.

A high level schematic diagram illustrating a second capacitor bank is shown in FIG. 13. In one embodiment, the capacitor bank, generally referenced 170, is used in the tracking banks 24 (FIG. 1) (128 unit weighted) for tracking purposes. It is also used in the modulation banks 26 (16 unit weighted).

Mobile Device Incorporating the DCO, DPA, ADPLL and/or Transmitter

Figure 14:
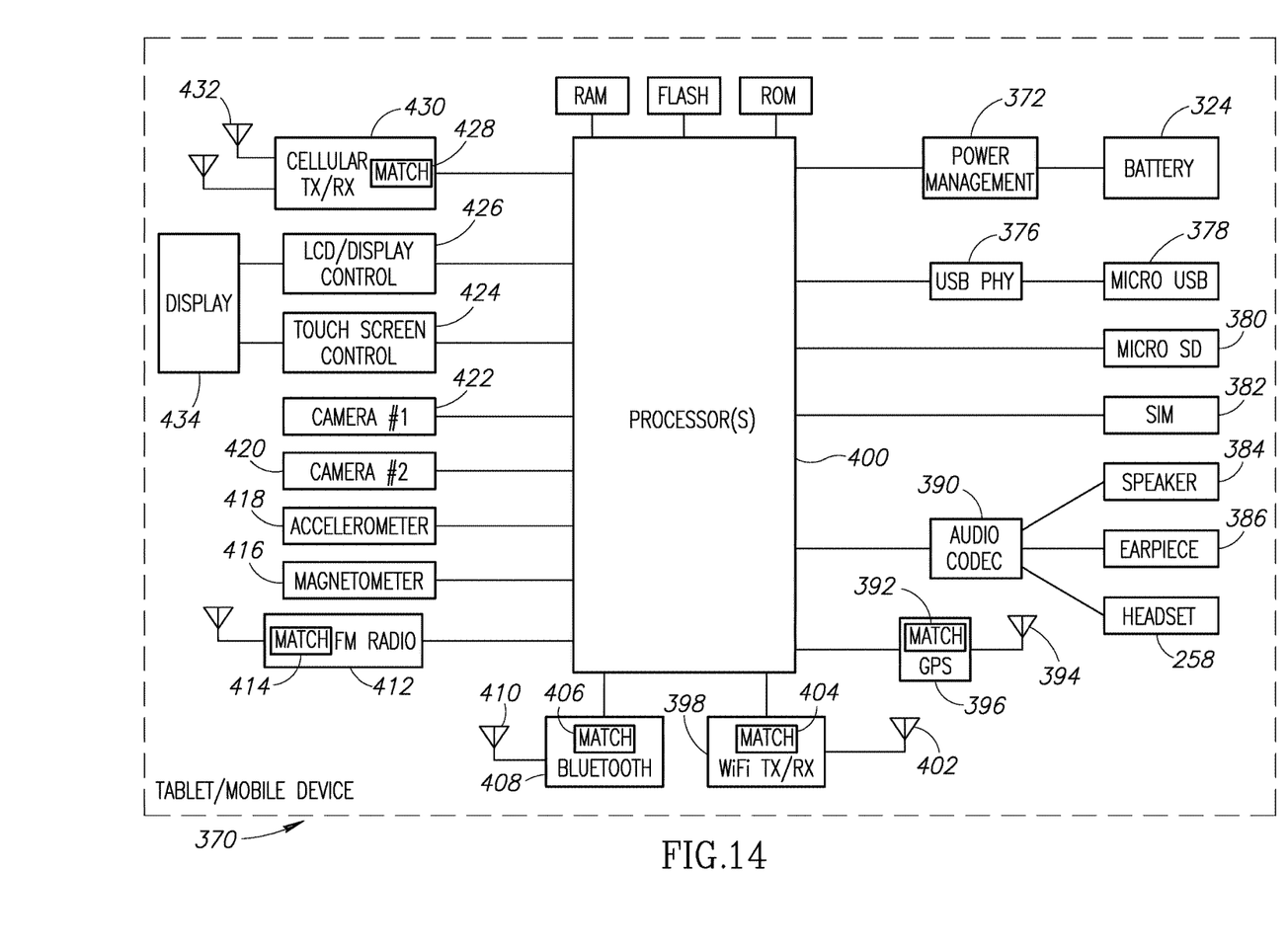
FIG. 14 is a block diagram illustrating an example mobile device incorporating the present invention.

A block diagram illustrating an example tablet/mobile device is shown in FIG. 14. The mobile device may incorporate any or all of the following features of the present invention: DCO, DPA with impedance matching network, ADPLL and the entire transmitter, all of which were described in detail supra. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 may comprise any or all of the following features of the present invention: DCO, DPA with impedance matching network, ADPLL and the entire transmitter, all of which were described in detail supra and referred to and denoted as "MATCH" in FIG. 14. Numerous embodiments of the mobile device 370 may comprise a MATCH circuit 428 as described supra incorporated in the one or more cellular radios 430; as MATCH circuit 414 as described supra incorporated in the FM radio 412; an MATCH circuit 406 as described supra incorporated in the Bluetooth radio 408; an MATCH circuit 404 as described supra incorporated in the Wi-Fi radio 398; and an MATCH circuit 396 as described supra incorporated in the GPS radio 392.

Internet of Things (IoT) Node Incorporating the Present Invention

The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 15:
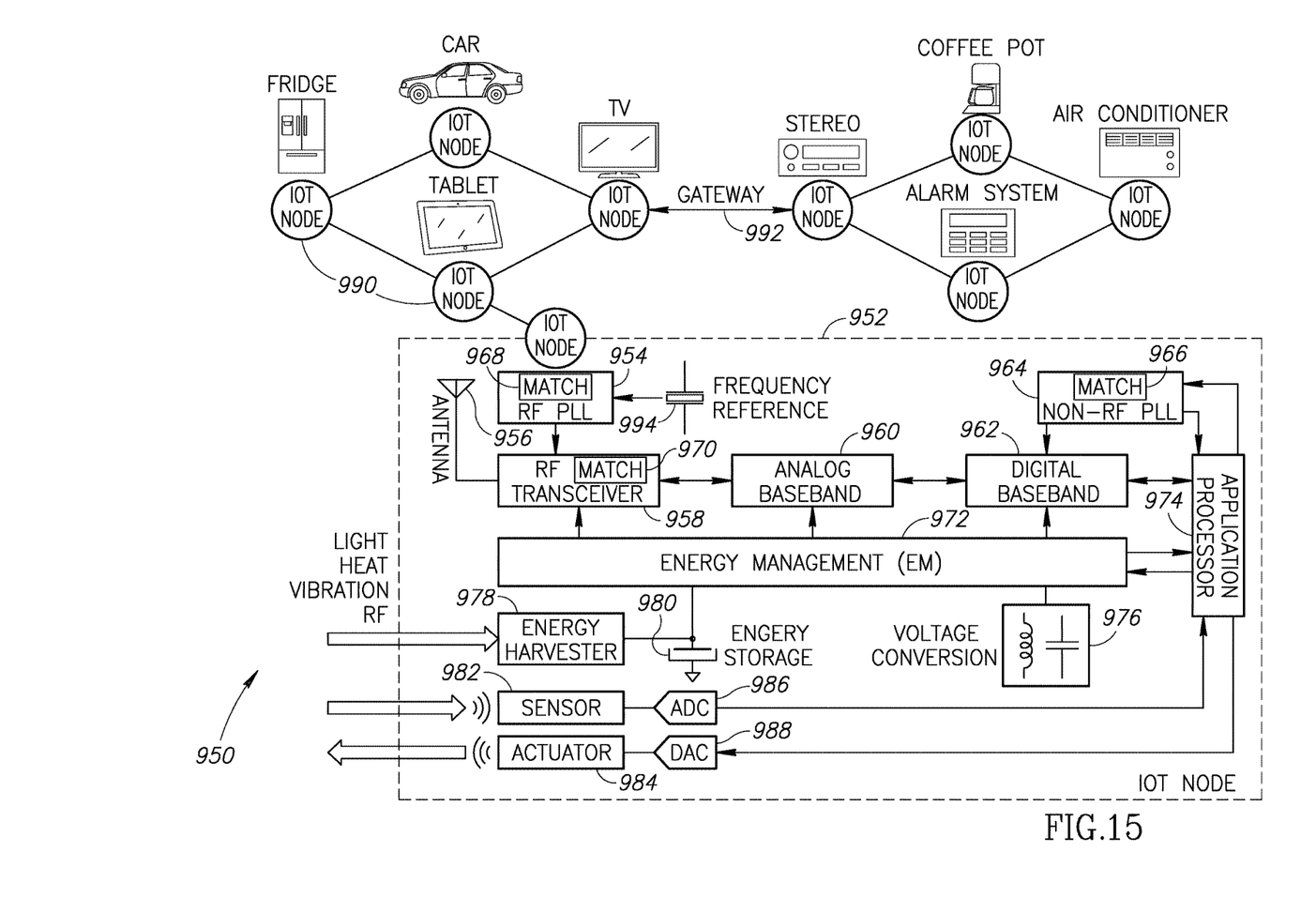
FIG. 15 is a block diagram illustrating an example IoT node incorporating the present invention.

A block diagram illustrating an example IoT node incorporating the oscillator/frequency generator of the present invention is shown in FIG. 15. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference 994 provides a fixed clock with excellent long term stability to the frequency synthesizers.

In accordance with the invention, the IoT node 952 may comprise any or all of the following features of the present invention: DCO, DPA with impedance matching network, ADPLL and the entire transmitter, all of which were described in detail supra and referred to and denoted as "MATCH" in FIG. 15. Numerous embodiments of the IoT node 952 may comprise a MATCH circuit 968 as described supra incorporated in the in the RF synthesizer 954; as MATCH circuit 966 as described supra incorporated in non-RF synthesizer 964; and as MATCH circuit 970 as described supra incorporated in RF transceiver 958.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from a battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely varies depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An impedance matching network receiving a driving signal consisting of both common mode and differential mode signal components, comprising:
   a transformer including:
      a primary winding configured to receive said driving signal;
      a secondary winding; and
      wherein exciting said primary winding with the common mode signal at a second harmonic frequency causes substantially no current to be induced on said secondary winding.

2. The impedance matching network according to claim 1, wherein said secondary winding is configured to resonate at a fundamental frequency.

3. The impedance matching network according to claim 1, wherein said magnetic flux excited by the common mode signal on turns of said primary winding at the second harmonic frequency is operative to cancel itself out thereby making the first inductance negligible resulting in substantially no current being induced on said secondary winding.

4. The impedance matching network according to claim 1, wherein a response by said transformer to a common mode signal is different than to a differential mode signal.

5. The impedance matching network according to claim 1, wherein said impedance matching network is part of a power amplifier.

6. The impedance matching network according to claim 1, wherein a primary winding center tap is coupled to a third inductance.

7. The impedance matching network according to claim 6, wherein the common mode inductance seen by transistors of a power amplifier coupled to said impedance matching network is substantially determined by said third inductance connected to said center tap.

8. The impedance matching network according to claim 6, wherein said third inductance is configured to resonate at said second harmonic frequency to realize class $E/F_2$ operation of the power amplifier.

9. An impedance matching network receiving a driving signal consisting of both common mode and differential mode signal components, comprising:
   a transformer including:
      a primary winding having a first inductance and configured to receive said driving signal;
      a secondary winding having a second inductance;
   a first capacitance coupled to said transformer primary winding;
   a second capacitance coupled to said transformer secondary winding; and
   wherein exciting said primary winding with the common mode signal at a second harmonic frequency causes substantially no current to be induced on said secondary winding.

10. The impedance matching network according to claim 9, wherein said magnetic flux excited by the common mode signal on turns of said primary winding at the second harmonic frequency is operative to cancel itself out thereby making the first inductance negligible resulting in substantially no current being induced on said secondary winding.

11. The impedance matching network according to claim 9, wherein a primary winding center tap is coupled to a third inductance.

12. The impedance matching network according to claim 11, wherein the common mode inductance seen by transistors of a power amplifier coupled to said impedance matching network is substantially determined by said third inductance connected to said center tap.

13. The impedance matching network according to claim 11, wherein said third inductance is configured to resonate at said second harmonic frequency to realize class $E/F_2$ operation of the power amplifier.

14. A class $E/F_2$ power amplifier, comprising:
   an amplifier comprising a plurality of switching transistors, said amplifier operative to control an amplitude modulation and to provide a driving signal;
   an impedance matching network coupled to the amplifier, said impedance matching network comprising:
      a transformer including a primary winding configured to receive said driving signal, and a secondary winding; and
      wherein exciting said primary winding with a common mode signal at a second harmonic frequency causes substantially no current to be induced on said secondary winding.

15. A mobile device, comprising:
   memory for storing application program code and data;
   a processor coupled to said memory;
   at least one radio transceiver coupled to said processor;
   said radio transceiver comprising an impedance matching network, said impedance matching network comprising:
      a transformer including a primary winding configured to receive a driving signal, and a secondary winding; and
      wherein exciting said primary winding with a common mode of said signal at a second harmonic frequency causes substantially no current to be induced on said secondary winding.

16. An Internet of Things (IoT) network, comprising:
   a plurality of nodes, one or more nodes comprising:
   a processor;
   a sensor coupled to said processor;
   a radio coupled to said processor;
      said radio comprising an impedance matching network, said impedance matching network comprising:
         a transformer including a primary winding configured to receive a driving signal, and a secondary winding; and
         wherein exciting said primary winding with a common mode of said signal at a second harmonic frequency causes substantially no current to be induced on said secondary winding.

17. A method of impedance matching, the method comprising:
   providing a transformer having a primary winding and a secondary winding;
   driving said primary winding with a signal containing a fundamental frequency and a second harmonic frequency; and
   in response to the signal at the second harmonic frequency, magnetic flux induced in said primary winding cancels itself out resulting in substantially no current being generated on said secondary winding.

18. The method according to claim 17, wherein in response to the signal at the fundamental frequency, a second tank circuit incorporating said secondary winding resonates at the fundamental frequency.

19. The method according to claim 17, wherein the magnetic flux excited by the signal on turns of said primary winding at the second harmonic frequency cancels itself out thereby making inductance of said primary winding negligible resulting in substantially no current being induced on said secondary winding.

20. The method according to claim 17, wherein said transformer responds to the fundamental frequency of the signal differently than to the second harmonic frequency of the signal.

21. The method according to claim 17, wherein a common mode inductance seen by transistors of a power amplifier coupled to said transformer is substantially determined by an inductance connected to a transformer primary center tap.

22. The method according to claim 21, wherein said inductance resonates with a capacitance at the second harmonic frequency to realize class $E/F_2$ operation of the power amplifier.

* * * * *